(12) United States Patent
Ma et al.

(10) Patent No.: US 12,422,908 B2
(45) Date of Patent: Sep. 23, 2025

(54) CHIP FREQUENCY CONTROL METHOD AND APPARATUS, BLOCKCHAIN SERVER, AND STORAGE MEDIUM

(71) Applicant: SHENZHEN MICROBT ELECTRONICS TECHNOLOGY CO., LTD., Guangdong (CN)

(72) Inventors: Weibin Ma, Guangdong (CN); Haifeng Guo, Guangdong (CN); Lihong Huang, Guangdong (CN); Yuefeng Wu, Guangdong (CN); Zuoxing Yang, Guangdong (CN)

(73) Assignee: SHENZHEN MICROBT ELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 18/275,743

(22) PCT Filed: Mar. 7, 2023

(86) PCT No.: PCT/CN2023/079988
§ 371 (c)(1),
(2) Date: Aug. 3, 2023

(87) PCT Pub. No.: WO2024/045540
PCT Pub. Date: Mar. 7, 2024

(65) Prior Publication Data
US 2025/0013277 A1  Jan. 9, 2025

(30) Foreign Application Priority Data

Sep. 2, 2022 (CN) .......................... 202211068131.4

(51) Int. Cl.
*G06F 1/20* (2006.01)
*G06F 1/28* (2006.01)
*H03K 5/00* (2006.01)

(52) U.S. Cl.
CPC ................ *G06F 1/206* (2013.01); *G06F 1/28* (2013.01); *H03K 5/00006* (2013.01)

(58) Field of Classification Search
CPC .............................. G06F 1/26; G06F 11/0793
See application file for complete search history.

(56) References Cited

U.S. PATENT DOCUMENTS

2023/0176639 A1* 6/2023 Ma .......................... G06F 1/266
713/340

FOREIGN PATENT DOCUMENTS

CN          106774767 A  *  5/2017
CN          108984360 A     12/2018
(Continued)

OTHER PUBLICATIONS

International Search Report and Written Opinion for PCT/CN2023/079988 dated Jun. 14, 2023 (25 pages which includes English Translation of International Search Report ).
(Continued)

*Primary Examiner* — Daniel C Puentes
(74) *Attorney, Agent, or Firm* — Merchant & Gould P.C.

(57) ABSTRACT

Embodiments of this application provide a chip frequency control method and apparatus, a blockchain server, and a storage medium. The method includes: determining a real-time computing power ratio of a chip of a blockchain server, a real-time temperature of the chip, and a real-time voltage of the chip; and adjusting a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip, wherein the reference computing power ratio, the reference temperature, and the reference voltage (Continued)

are determined when the blockchain server undergoes a frequency rising phase after start-up and enters a working status. When an exception occurs in the chip, timely and appropriate response can improve stability of the blockchain server.

17 Claims, 4 Drawing Sheets

(56) References Cited

FOREIGN PATENT DOCUMENTS

| CN | 111736059 A | 10/2020 |
|---|---|---|
| CN | 111752361 A | 10/2020 |
| CN | 111966202 A | 11/2020 |
| CN | 112269981 A | 1/2021 |
| CN | 112327711 A | 2/2021 |
| CN | 213659380 U | 7/2021 |
| CN | 114880124 A | 8/2022 |
| CN | 115145761 A | 10/2022 |
| WO | 2022037145 A1 | 2/2022 |
| WO | 2022110743 A1 | 6/2022 |

OTHER PUBLICATIONS

First Office Action issued for CN Application No. 202211068131.4 (11 pages including English Translation).
Search Report issued with First Office Action for CN Application No. 202211068131.4 (1 page).
Notification to Grant Patent Right for Invention for CN Application No. 202211068131.4 (3 pages including English Translation).
Search Report issued with Notification to Grant Patent Right for Invention for CN Application No. 202211068131.4 (1 page).

* cited by examiner ic power compensation chip whose real-time computing power ratio reaches the computing power ratio threshold.

CHIP FREQUENCY CONTROL METHOD AND APPARATUS, BLOCKCHAIN SERVER, AND STORAGE MEDIUM

CROSS-REFERENCE TO RELATED APPLICATIONS

This application is a National Stage Application of International Application No. PCT/CN2023/079988, filed 7 Mar. 2023, which claims benefit of Serial No. 202211068131.4, filed 2 Sep. 2022 in China, and which applications are incorporated herein by reference. To the extent appropriate, a claim of priority is made to each of the above disclosed applications.

TECHNICAL FIELD

This application belongs to the field of blockchain technologies, and in particular, relates to a chip frequency control method and apparatus, a blockchain server, and a storage medium.

BACKGROUND

Generally, a blockchain technology is a new distributed infrastructure and computing manner that uses a block chained data structure to verify and store data, uses distributed nodes consensus algorithm to generate and update data, uses a cryptography manner to ensure security of data transmission and access, and uses a smart contract including automated script codes to program and manipulate data. A blockchain network is a decentralized network, a peer-to-peer (P2P) network. In the blockchain network, there is no centralized service or hierarchical structure, each node is a peer-to-peer node, and all the nodes jointly provide network services. The nodes in the blockchain network are both clients and servers.

SUMMARY

Embodiments of this application provide a chip frequency control method and apparatus, a blockchain server, and a storage medium.

Technical solutions of the present disclosure are as follows:

A chip frequency control method including:
determining a real-time computing power ratio of a chip of a blockchain server, a real-time temperature of the chip, and a real-time voltage of the chip; and
adjusting a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip, wherein the reference computing power ratio, the reference temperature, and the reference voltage are determined when the blockchain server undergoes a start-up and frequency rising phase and enters a working status.

In exemplary embodiments, the adjusting a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip includes at least one of the following:
reducing the setting frequency when the first comparison result indicates that the real-time computing power ratio is reduced compared with the reference computing power ratio, the second comparison result indicates that the real-time temperature remains unchanged compared with the reference temperature, and the third comparison result indicates that the real-time voltage is reduced compared with the reference voltage;
reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage is reduced compared with the reference voltage; and
reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage remains unchanged compared with the reference voltage.

In exemplary embodiments, further including:
determining computing power compensation chip(s) among chips in the blockchain server other than chip(s) whose setting frequency (frequencies) is (are) reduced; and
increasing setting frequency (frequencies) of the computing power compensation chip(s).

In exemplary embodiments, the computing power compensation chip(s) includes at least one of the following:
a real-time computing power ratio of the computing power compensation chip is greater than or equal to a predetermined threshold, a real-time temperature of the computing power compensation chip is equal to a reference temperature of the computing power compensation chip, and a real-time voltage of the computing power compensation chip is greater than a reference voltage of the computing power compensation chip;
the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is equal to the reference voltage of the computing power compensation chip; and
the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is greater than the reference voltage of the computing power compensation chip.

In exemplary embodiments, further including: determining, among chip(s) whose setting frequencies has (have) been reduced in the blockchain server, a chip whose real-time computing power ratio reaches a computing power ratio threshold at a predetermined time after the setting frequency is reduced as a computing power compensation chip; and increasing the setting frequency of the computing power compensation chip at a frequency adjustment moment corresponding to the predetermined time.

In exemplary embodiments, the determining a real-time computing power ratio of a chip of a blockchain server includes:

determining a theoretical computing power of the chip based on a quantity of cores in the chip and the setting frequency;

determining a real-time actual computing power of the chip based on a total quantity of arbitrary or non-repeating numbers (Nonce) that are used only once within a predetermined time up to a current moment, a Nonce difficulty of the chip, and the predetermined time; and determining a ratio of the real-time actual computing power to the theoretical computing power as the real-time computing power ratio.

A chip frequency control apparatus includes:

a determining module, configured to determine a real-time computing power ratio of a chip of a blockchain server, a real-time temperature of the chip, and a real-time voltage of the chip; and an adjustment module, configured to adjust a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip, wherein the reference computing power ratio, the reference temperature, and the reference voltage are determined when the blockchain server undergoes a start-up and frequency rising phase and enters a working status.

In exemplary embodiments, the adjustment module is configured to perform at least one of the following operations:

reducing the setting frequency when the first comparison result indicates that the real-time computing power ratio is reduced compared with the reference computing power ratio, the second comparison result indicates that the real-time temperature remains unchanged compared with the reference temperature, and the third comparison result indicates that the real-time voltage is reduced compared with the reference voltage;

reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage is reduced compared with the reference voltage; and reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage remains unchanged compared with the reference voltage.

In exemplary embodiments, the adjustment module is configured to determine computing power compensation chip(s) among chips in the blockchain server other than chip(s) whose setting frequency (frequencies) is (are) reduced; and increase setting frequency (frequencies) of the computing power compensation chip(s).

In exemplary embodiments, the computing power compensation chip(s) includes (include) at least one of the following:

a real-time computing power ratio of the computing power compensation chip is greater than or equal to a predetermined threshold, a real-time temperature of the computing power compensation chip is equal to a reference temperature of the computing power compensation chip, and a real-time voltage of the computing power compensation chip is greater than a reference voltage of the computing power compensation chip;

the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is equal to the reference voltage of the computing power compensation chip; and the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is greater than the reference voltage of the computing power compensation chip.

In exemplary embodiments, the adjustment module is configured to determine, among chip(s) whose setting frequency (frequencies) has (have) been reduced in the blockchain server, a chip whose real-time computing power ratio reaches a computing power ratio threshold at a predetermined time after the setting frequency is reduced as a computing power compensation chip; and increase the setting frequency of the computing power compensation chip at a frequency adjustment moment corresponding to the predetermined time.

In exemplary embodiments, the determining module is configured to: determine a theoretical computing power of the chip based on a quantity of cores in the chip and the setting frequency; determine a real-time actual computing power of the chip based on a total quantity of arbitrary or non-repeating numbers (Nonce) that are used only once within a predetermined time up to a current moment, a Nonce difficulty of the chip, and the predetermined time; and determine a ratio of the real-time actual computing power to the theoretical computing power as the real-time computing power ratio.

A blockchain server includes:

a chip board, including a plurality of chips; and a control board, including: a memory and a processor, wherein the memory stores an application program executable by the processor, to cause the processor to perform the chip frequency control method according to any one of the above, wherein the chip board has a signal connection with the control board through a signal connection interface, and the chip board has an power connection with a power supply through a power supply connection interface.

A computer-readable storage medium, storing a computer-readable instruction, wherein the computer-readable instruction is used to implement the chip frequency control method according to any one of the above.

It can be learned from the foregoing technical solutions that, in the embodiments of this application, a real-time computing power ratio of a chip of a blockchain server, a real-time temperature of the chip, and a real-time voltage of the chip are determined; a setting frequency of the chip is adjusted based on a first comparison result of the real-time computing power ratio with a reference computing power ratio of the chip, a second comparison result of the real-time temperature with a reference temperature of the chip, and a third comparison result of the real-time voltage with a reference voltage of the chip, wherein the reference computing power ratio, the reference temperature, and the reference voltage are determined when the blockchain server undergoes a frequency rising phase after start-up and enters a working status. It can be learned that, when an exception occurs in the chip, appropriate response can be made timely in the embodiments of this application, thereby improving stability of the blockchain server.

DETAILED DESCRIPTION

To make the objectives, technical solutions, and advantages of this application clearer, the following further describes this application in further detail with reference to the accompanying drawings.

For concise and intuitive descriptions, solutions of this application are stated below by describing several representative embodiments. A large quantity of details in the embodiments are merely used for helping understand the solutions of this application. However, obviously, implementation of the technical solutions of this application may not be limited to these details. To avoid unnecessarily blurring the solutions of this application, some embodiments are not described in detail, but only frames are provided. In the following, "including" refers to "including, but not limited to", and "according to . . . " refers to "at least according to . . . , but not limited to only according to . . . ". Due to Chinese language habits, when a quantity of components is not particularly specified, it means that there may be one or more components, or understandably, there may be at least one component.

It is found by the applicants that, in some related technologies, after a blockchain server undergoes a frequency rising phase after start-up and enters a working status, a frequency of each chip of the blockchain server usually remains unchanged. However, when a temperature status of the blockchain server changes compared with a temperature status at the beginning of the working status (for example, an ambient temperature or a rotational speed of a fan changes), temperatures of chips at different locations in a chip board may change, and voltages of the chips may also change due to a difference in electric leakage between the chips, resulting in a decrease in computing power ratios of some chips (for example, a chip at an air inlet when the ambient temperature decreases). Maintaining frequencies of these chips with reduced computing power ratios unchanged is a hidden danger to the stability of the blockchain server, and there is no optimization mechanism for the frequencies of the chips in the related technologies.

Figure 1:
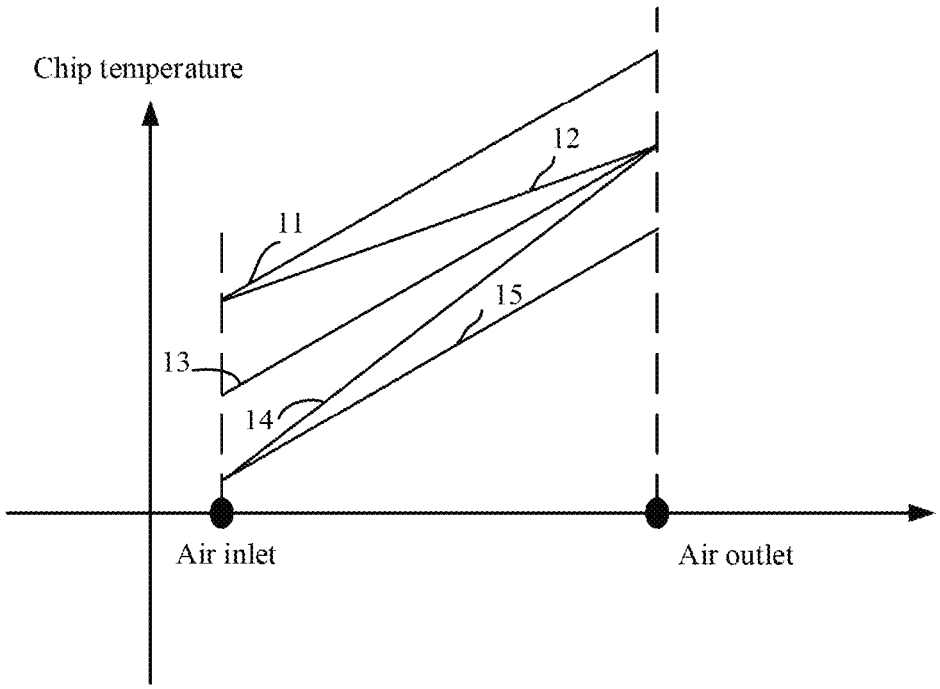
FIG. 1 is a schematic diagram of a mapping relationship between chip arrangement locations and chip temperatures.

FIG. 1 is a schematic diagram of a mapping relationship between chip arrangement locations and chip temperatures. In FIG. 1, a horizontal coordinate is a wind direction, and a longitudinal coordinate is a chip temperature. In FIG. 1, a line segment 13 corresponds to a reference temperature status. The reference temperature status is that a server undergoes a frequency rising phase after start-up and just enters a working status.

A line segment 11 corresponds to a first temperature status. Compared with the reference temperature status, a rotational speed of a fan in the first temperature status remains unchanged, an ambient temperature rises, and both an air inlet temperature and an air outlet temperature rise. A line segment 12 corresponds to a second temperature status. Compared with the reference temperature status, a rotational speed of a fan in the second temperature status increases, an ambient temperature rises, a chip temperature at an air outlet remains unchanged, and a chip temperature at an air inlet rises. A line segment 14 corresponds to a third temperature status. Compared with the reference temperature status, a rotational speed of a fan in the third temperature status decreases, an ambient temperature decreases, a chip temperature at an air outlet remains unchanged, and a chip temperature at an air inlet decreases. A line segment 15 corresponds to a fourth temperature status. Compared with the reference temperature status, a rotational speed of a fan in the fourth temperature status remains unchanged, an ambient temperature decreases, a chip temperature at an air inlet decreases, and a chip temperature at an air outlet decreases.

It can be learned that, when a temperature status of a blockchain server changes relative to the reference temperature status, chip temperatures at different locations in a chip board all may change, or even a trend of changing of overall temperature of the chip board (represented by a slope of a line segment) may change, resulting in a decrease in computing power ratios (a ratio between an actual computing power and a theoretical computing power of a chip) of some chips. If such chips are not processed, the computing power ratios of such chips may continue to drop sharply, affecting the stability of the entire chip board.

Based on the foregoing analysis, embodiments of this application propose a chip frequency control method, which is suitable for controlling chip frequency (frequencies) in a chip board of a blockchain server, to adjust computing power ratio(s) of chip(s) to enhance the stability of the entire chip board.

Figure 2:
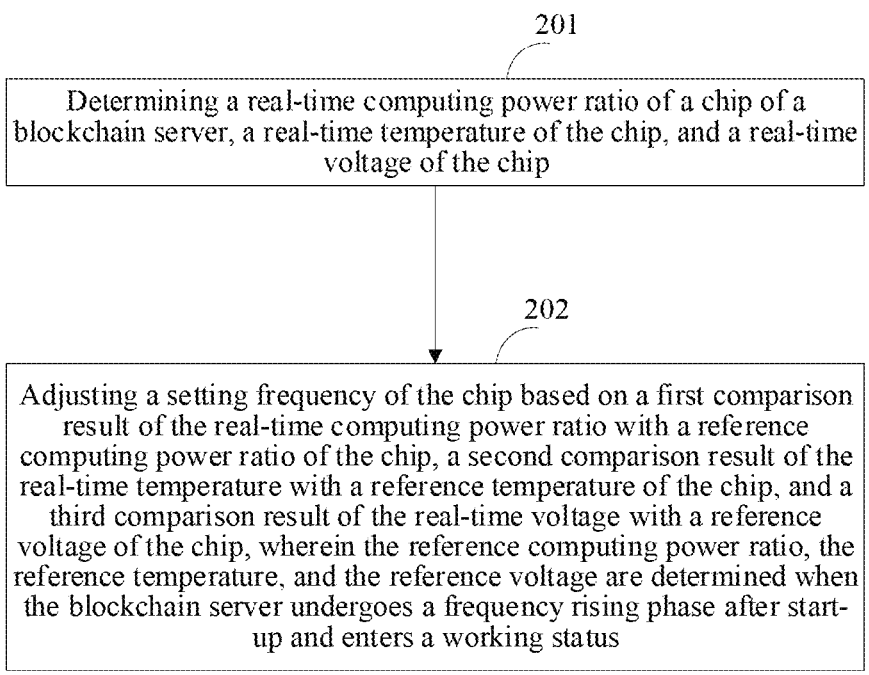
FIG. 2 is an exemplary flowchart of a chip frequency control method according to embodiments of this application.

FIG. 2 is an exemplary flowchart of a chip frequency control method according to embodiments of this application.

As shown in FIG. 2, the method includes:

Step 201: Determining a real-time computing power ratio of a chip of a blockchain server, a real-time temperature of the chip, and a real-time voltage of the chip.

The blockchain server usually includes a chip board, and the chip board includes a plurality of chips. A voltage sensor and a temperature sensor of each chip may be used to respectively detect a real-time voltage and a real-time temperature of the corresponding chip. In step 201, a real-time computing power ratio of each chip is calculated. The real-time computing power ratio represents a ratio between a real-time actual computing power of the chip and a theoretical computing power of the chip.

In an embodiment, determining a real-time computing power ratio of a chip of a blockchain server includes: determining a theoretical computing power of the chip based on a quantity of cores in the chip and the setting frequency of the chip; determining a real-time actual computing power of the chip based on a total Nonce quantity of the chip within a predetermined time up to a current moment, a Nonce difficulty of the chip, and the predetermined time; and determining a ratio of the real-time actual computing power to the theoretical computing power as the real-time computing power ratio. In this case, Nonce is an abbreviation of "Number used once" or "Number once", meaning an arbitrary number or a non-repeating number that is used only once, wherein the number is, for example, a random number, specifically referring to a random number that matches the difficulty of digital currency mining.

For example, the theoretical computing power P of the chip is equal to a product of a quantity C of cores in the chip and a setting frequency F of the chip, that is, $P=C*F$. The real-time actual computing power K of the chip has the following expression: $K=(M*Q)/T$; wherein M is a total Nonce quantity of the chip within a predetermined time T up to a current moment (for example, one minute before the current moment); Q is a Nonce difficulty of the chip; and T is a length of the predetermined time. The ratio between the real-time actual computing power K and the theoretical computing power P of the chip is determined as the real-time computing power ratio S of the blockchain server, that is, $S=((M*Q)/T)/(C*F)$.

Step 202: Adjusting a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip, wherein the reference computing power ratio, the reference temperature, and the reference voltage are determined when the blockchain server undergoes a start-up and frequency rising phase and enters a working status.

After start-up, the blockchain server first enters a frequency rising phase (also referred to as a frequency search phase) in which a frequency of each chip gradually increases, and then enters a working status in which the frequency of each chip remains unchanged. After undergoing the frequency rising phase and just entering the working status (or at a predetermined moment after entering the working status), a real-time voltage, a real-time temperature, and a real-time computing power ratio of each chip are determined. The real-time voltage at this time is determined as a reference voltage of the chip, the real-time temperature at this time is determined as a reference temperature of the chip, and the real-time computing power ratio at this time is determined as a reference computing power ratio of the chip. After being determined, the reference temperature, the reference voltage, and the reference computing power ratio of the chip may be used for a subsequent comparison process to determine whether an exception occurs in the chip.

At any moment in the working status (which needs to be after the reference computing power ratio, the reference temperature, and the reference voltage are determined), step 201 is performed to determine the real-time computing power ratio of each chip of the blockchain server, the real-time temperature of the chip, and the real-time voltage of the chip. The real-time computing power ratio, the real-time temperature, and the real-time voltage of each chip in step 201 are respectively compared with the reference computing power ratio, the reference temperature, and the reference voltage of the chip, to obtain the first comparison result of the real-time computing power ratio with the reference computing power ratio, the second comparison result of the real-time temperature with the reference temperature, and the third comparison result of the real-time voltage with the reference voltage. Based on the first comparison result, the second comparison result, and the third comparison result of each chip, respective control policies may be carried out respectively for corresponding chips.

Figure 3:
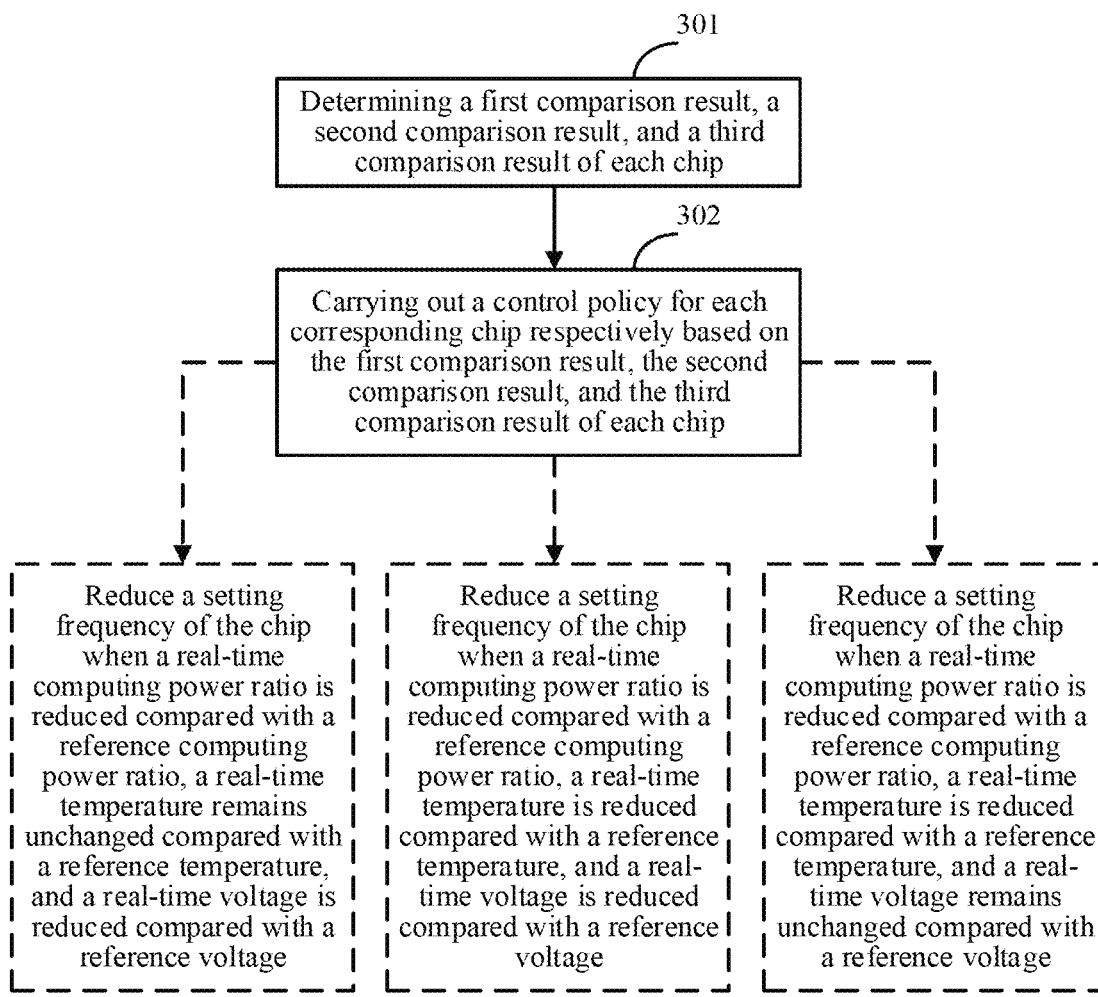
FIG. 3 is a schematic diagram of processes of reducing a setting frequency of a chip according to embodiments of this application.

FIG. 3 is a schematic diagram of processes of reducing a setting frequency of a chip according to embodiments of this application.

In FIG. 3, Step 301: Determining a first comparison result, a second comparison result, and a third comparison result of each chip.

Step 302: Carrying out a control policy for each corresponding chip respectively based on the first comparison result, the second comparison result, and the third comparison result of each chip.

Specifically, the control policy in step 302 includes any one of the following control policy 1, control policy 2, and control policy 3.

Control Policy 1

When the first comparison result indicates that the real-time computing power ratio is reduced compared with the reference computing power ratio, the second comparison result indicates that the real-time temperature remains unchanged compared with the reference temperature, and the third comparison result indicates that the real-time voltage is reduced compared with the reference voltage, the setting frequency is reduced.

For example: it is assumed that when the blockchain server undergoes the frequency rising phase and just enters the working status, a reference temperature of a chip A in the blockchain server is T1, a reference voltage of the chip A is V1, and a reference computing power ratio of the chip A is S1. When it is detected in the working status that a real-time computing power ratio of the chip A is less than S1, a real-time temperature of the chip A is equal to T1, and a real-time voltage of the chip A is less than V1, a setting frequency of the chip A is reduced. For example, the setting frequency of the chip A is reduced by a predetermined range (for example, 6 MHZ). After the setting frequency of the chip A is reduced, an actual computing power of the chip A usually decreases, but a theoretical computing power of the chip A also decreases, so that the computing power ratio of the chip A can be effectively prevented from dropping sharply.

Control Policy 2

When the first comparison result indicates that the real-time computing power ratio is reduced compared with the reference computing power ratio, the second comparison result indicates that the real-time temperature is reduced compared with the reference temperature, and the third comparison result indicates that the real-time voltage is reduced compared with the reference voltage, the setting frequency is reduced.

For example: it is assumed that when the blockchain server undergoes the frequency rising phase and just enters the working status, a reference temperature of a chip B in the blockchain server is T2, a reference voltage of the chip B is V2, and a reference computing power ratio of the chip B is S2. When it is detected in the working status that a real-time computing power ratio of the chip B is less than S2, a real-time temperature of the chip B is less than T2, and a real-time voltage of the chip B is less than V2, a setting frequency of the chip B is reduced at this time. For example, the setting frequency of the chip B is reduced by a predetermined range (for example, 6 M). After the setting frequency of the chip B is reduced, an actual computing power of the chip B usually decreases, but a theoretical computing power of the chip B also decreases, so that the computing power ratio of the chip B can be effectively prevented from dropping sharply.

Control Policy 3

When the first comparison result indicates that the real-time computing power ratio is reduced compared with the reference computing power ratio, the second comparison result indicates that the real-time temperature is reduced compared with the reference temperature, and the third comparison result indicates that the real-time voltage remains unchanged compared with the reference voltage, the setting frequency is reduced.

For example: it is assumed that when the blockchain server undergoes the frequency rising phase and just enters the working status, a reference temperature of a chip C in the blockchain server is T3, a reference voltage of the chip C is V3, and a reference computing power ratio of the chip C is S3. When it is detected in the working status that a real-time computing power ratio of the chip C is less than S3, a real-time temperature of the chip C is less than T3, and a real-time voltage of the chip C is equal to V3, a setting frequency of the chip C is reduced at this time. For example, the setting frequency of the chip C is reduced by a predetermined range (for example, 6 M). After the setting frequency of the chip C is reduced, an actual computing power of the chip C usually decreases, but a theoretical computing power of the chip C also decreases, so that the computing power ratio of the chip C can be effectively prevented from dropping sharply.

For a chip in the blockchain server that does not conform to any one of the foregoing control policies, a setting frequency of the chip may remain unchanged. Considering a need to maintain an overall computing power of the blockchain server, computing power compensation chip(s) may be selected from chips that do not conform to any one of the foregoing control policies, and setting frequency (frequencies) of the computing power compensation chip(s) is (are) increased to compensate for a computing power loss caused by the decrease in the chip frequency (frequencies) due to conformity to any one of the foregoing control policies. A sum of increase values of the setting frequencies of all computing power compensation chips is equal to a sum of frequency decrease values of all chips that conform to any one of the foregoing control policies.

In an embodiment, the following are further included: determining a computing power compensation chip among chips in the blockchain server other than chip(s) whose setting frequency (frequencies) is (are) reduced; and increasing a setting frequency of the computing power compensation chip.

It can be learned that, increasing the setting frequency of the computing power compensation chip determined among chips whose frequencies are not reduced can effectively offset a computing power decrease caused by reducing the chip frequency.

Figure 4:
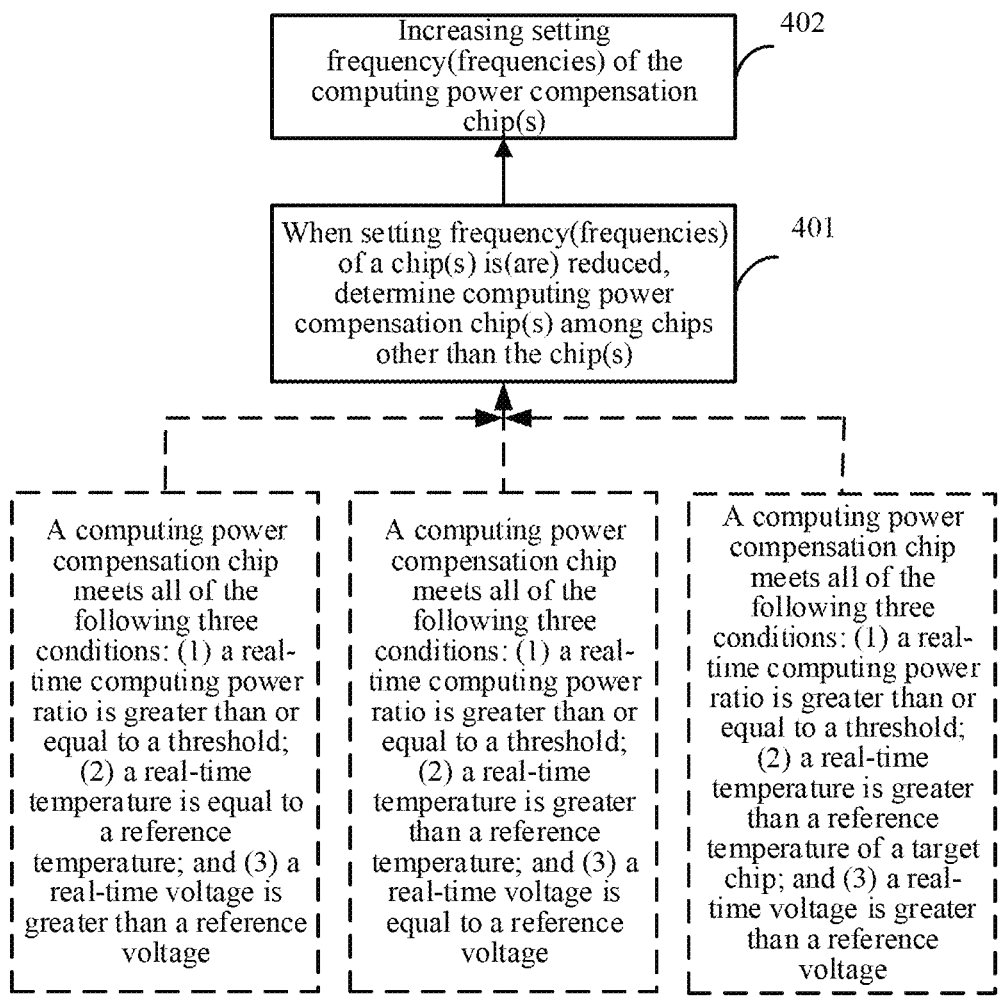
FIG. 4 is a schematic diagram of processes of compensating for a computing power loss according to embodiments of this application.

FIG. 4 is a schematic diagram of processes of compensating for a computing power loss according to embodiments of this application.

Step 401: when there is (are) chip(s) in a blockchain server whose setting frequency (frequencies) is (are) reduced, a computing power compensation chip (chips) is (are) determined among other chips in the blockchain server other than the chip(s) whose setting frequency (frequencies) is (are) reduced.

In an embodiment, the computing power compensation chip(s) meets (meet) at least one of the following conditions:
(1) A real-time computing power ratio of the computing power compensation chip is greater than or equal to a predetermined threshold (for example, the threshold is 100%), a real-time temperature of the computing power compensation chip is equal to a reference temperature of the computing power compensation chip, and a real-time voltage of the computing power compensation chip is greater than a reference voltage of the computing power compensation chip.
(2) The real-time computing power ratio of the computing power compensation chip is greater than or equal to the threshold, the real-time temperature of the computing power compensation chip is greater than the reference temperature of the computing power compensation chip, and the real-time voltage of the computing power compensation chip is equal to the reference voltage of the computing power compensation chip.
(3) The real-time computing power ratio of the computing power compensation chip is greater than or equal to the threshold, the real-time temperature of the computing power compensation chip is greater than the reference temperature of the computing power compensation chip, and the real-time voltage of the computing power compensation chip is greater than the reference voltage of the computing power compensation chip.

Step 402: setting frequency (frequencies) of the computing power compensation chip(s) is (are) increased. A sum of setting frequency increase values of all computing power compensation chips is equal to a sum of frequency decrease values of chips that conform to any one of the foregoing control policies.

Considering that a working status of the blockchain server usually lasts for a relatively long time, a frequency adjustment process of a chip is, for example, a plurality of rounds/times of dynamic adjustment. For example, there is a predetermined cycle time interval between two rounds/times of dynamic adjustment.

In an embodiment, the following are further included: determining, among chips whose setting frequencies have been reduced in the blockchain server, a chip whose real-time computing power ratio reaches a computing power ratio threshold at a predetermined time after the setting frequency is reduced (usually at a next round of dynamic adjustment) as a computing power compensation chip; and increasing a setting frequency of the computing power compensation chip at a frequency adjustment moment corresponding to the predetermined time.

For example, it is assumed that in a first round of dynamic adjustment performed at a first cycle time, frequencies of a chip A, a chip B, and a chip C are respectively reduced due to conformity of the chips to any one of the foregoing control policies. In a second round of dynamic adjustment performed at a second cycle time, a frequency of a chip D is reduced due to conformity of the chip to any one of the foregoing control policies, and it is determined at this time that a real-time computing power ratio of the chip A at the second cycle time has reached a predetermined computing power ratio threshold (for example, 100%). In this case, in the second round of dynamic adjustment, the frequency of the chip A is increased to compensate for a computing power loss of the chip D. A value of the computing power ratio threshold is, for example, adjustable.

It can be learned that a chip whose frequency has been reduced in the previous dynamic adjustment is determined as a computing power compensation chip by using a relatively loose determining condition (considering only the real-time computing power ratio, and no longer considering the real-time temperature and the real-time voltage), so that a computing power decrease caused by a decrease in the chip frequency in a current round of dynamic adjustment can be effectively offset.

Figure 5:
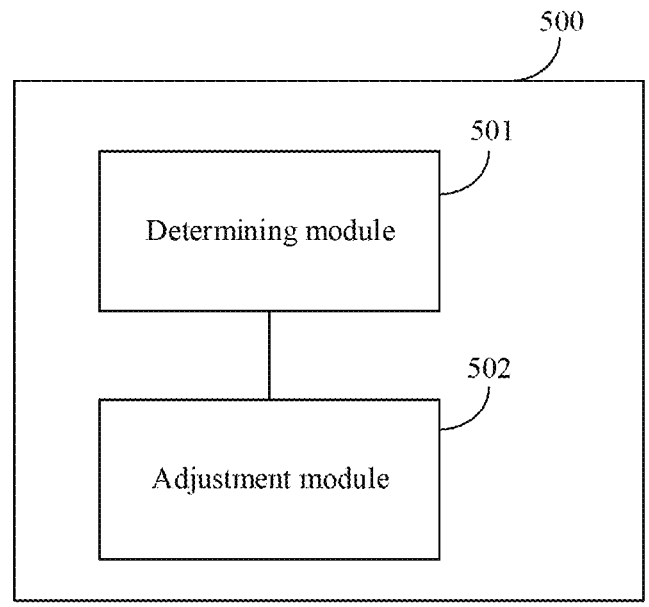
FIG. 5 is an exemplary structural diagram of a chip frequency control apparatus according to embodiments of this application.

FIG. 5 is an exemplary structural diagram of a chip frequency control apparatus according to embodiments of this application. The chip frequency control apparatus 500 includes:

- a determining module 501, configured to determine a real-time computing power ratio of a chip of a blockchain server, a real-time temperature of the chip, and a real-time voltage of the chip; and
- an adjustment module 502, configured to adjust a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip, wherein the reference computing power ratio, the reference temperature, and the reference voltage are determined when the blockchain server undergoes a start-up and frequency rising phase and enters a working status.

In an embodiment, the adjustment module 502 is configured to perform at least one of the following operations: reducing the setting frequency when the first comparison result indicates that the real-time computing power ratio is reduced compared with the reference computing power ratio, the second comparison result indicates that the real-time temperature remains unchanged compared with the reference temperature, and the third comparison result indicates that the real-time voltage is reduced compared with the reference voltage; reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage is reduced compared with the reference voltage; and reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage remains unchanged compared with the reference voltage.

In an embodiment, the adjustment module 502 is configured to determine a computing power compensation chip among chips in the blockchain server other than chip(s) whose setting frequency (frequencies) is (are) reduced; and increase a setting frequency of the computing power compensation chip.

In an embodiment, the computing power compensation chip includes at least one of the following: a real-time computing power ratio of the computing power compensation chip is greater than or equal to a predetermined threshold, a real-time temperature of the computing power compensation chip is equal to a reference temperature of the computing power compensation chip, and a real-time voltage of the computing power compensation chip is greater than a reference voltage of the computing power compensation chip; the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is equal to the reference voltage of the computing power compensation chip; and the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is greater than the reference voltage of the computing power compensation chip.

In an embodiment, the adjustment module 502 is configured to determine, among chip(s) whose setting frequency (frequencies) has (have) been reduced in the blockchain server, a chip whose real-time computing power ratio reaches a computing power ratio threshold at a predetermined time after the setting frequency is reduced as a computing power compensation chip; and increase the setting frequency of the computing power compensation chip at a frequency adjustment moment corresponding to the predetermined time.

In an embodiment, the determining module 501 is configured to: determine a theoretical computing power of the chip based on a quantity of cores in the chip and the setting frequency; determine a real-time actual computing power of the chip based on a total Nonce quantity of the chip within a predetermined time up to a current moment, a Nonce difficulty of the chip, and the predetermined time; and determine a ratio of the real-time actual computing power to the theoretical computing power as the real-time computing power ratio.

Figure 6:
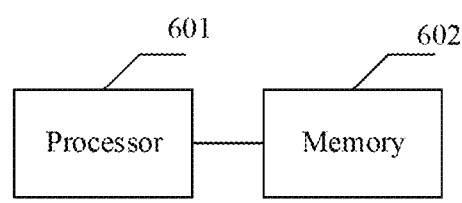
FIG. 6 is an exemplary structural diagram of a chip frequency control apparatus with a memory-processor architecture according to embodiments of this application.

FIG. 6 is an exemplary structural diagram of a chip frequency control apparatus with a memory-processor architecture according to embodiments of this application.

As shown in FIG. 6, the chip frequency control apparatus includes: a processor 601; and a memory 602, wherein the memory 602 stores an application program executable by the processor 601 therein, to cause the processor 601 to perform the chip frequency control method according to the foregoing embodiments.

The memory 602 may be specifically implemented as various storage mediums such as an electrically erasable programmable read-only memory (EEPROM), a flash memory, and a programmable read-only memory (PROM). The processor 601 may be implemented as including one or more central processing units (CPUs) or one or more field-programmable gate arrays (FPGAs), wherein the FPGA integrates one or more CPU cores. Specifically, the CPU or the CPU core may be implemented as a CPU, an MCU, or a digital signal processor (DSP).

Figure 7:
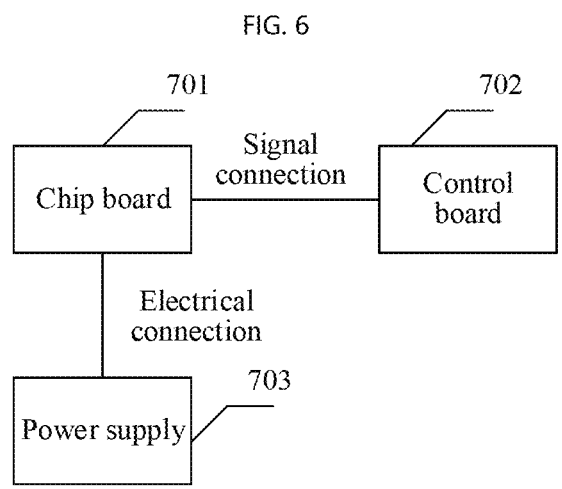
FIG. 7 is an exemplary structural diagram of a blockchain server according to embodiments of this application.

Embodiments of this application further provide a blockchain server. FIG. 7 is an exemplary structural diagram of a blockchain server according to embodiments of this application.

As shown in FIG. 7, the blockchain server includes:
a chip board 701, wherein the chip board 701 includes a plurality of chips; and
a control board 702, including: a memory and a processor, wherein the memory stores an application program executable by the processor, to cause the processor to perform the chip frequency control method as described in any of the above; wherein the chip board 701 has a signal connection with the control board 702 through a signal connection interface, and the chip board 701 forms a power connection with a power supply 703 through a power supply connection interface.

It should be noted that, not all steps and modules in the foregoing procedures and the structural diagrams are necessary, and some steps or modules may be omitted according to actual needs. The steps are not performed in a fixed order, and the order may be adjusted according to needs. The functional division used for the division of each module is only for the convenience of description. During actual implementation, one module may be implemented separately by a plurality of modules, and functions of the plurality of modules may alternatively be implemented by the same module. The modules may be located in the same device or in different devices.

Hardware modules in the embodiments may be implemented mechanically or electronically. For example, a hardware module may include specially designed permanent circuits or logic devices (for example, an application-specific processor such as an FPGA or an ASIC) to complete specific operations. The hardware module may also include programmable logic devices or circuits (for example, including a universal processor or other programmable processors) temporarily configured by software to perform specific operations. Whether the hardware module is specifically implemented by using the mechanical manner, using the application-specific permanent circuits, or using the temporarily configured circuits (for example, configured by software) can be decided according to consideration of costs and time.

This application further provides a machine-readable storage medium, storing instructions used for causing a machine to perform the method according to this application. Specifically, a system or an apparatus that is equipped with a storage medium may be provided. The storage medium stores software program code for implementing functions of any one of the foregoing embodiments thereon, and a computer (or a CPU or an MPU) of the system or the apparatus is enabled to read and execute the program code stored in the storage medium. In addition, program code-based instructions may also be used to enable an operating system or the like running in the computer to complete some or all actual operations. The program code read from the storage medium may also be written into a memory disposed in an expansion board inserted in the computer, or may be written into a memory disposed in an expansion unit connected to the computer, and then a CPU or the like that is installed on the expansion board or the expansion unit may be enabled to perform some or all actual operations based on the instructions of the program code, so as to implement the functions of any one of the foregoing embodiments.

Embodiments of the storage medium for providing the program code include a floppy disk, a hard disk, a magneto-optical disk, an optical disc (such as a CD-ROM, a CD-R, a CD-RW, a DVD-ROM, a DVD-RAM, a DVD-RW, or a DVD+RW), a magnetic tape, a non-volatile storage card, and a ROM. Optionally, the program code may be downloaded from a server computer or a cloud through a communication network.

The foregoing descriptions are merely preferred embodiments of this application, and are not intended to limit the protection scope of this application. Any modification, equivalent replacement, or improvement made without departing from the spirit and principle of this application shall fall within the protection scope of this application.

What is claimed is:

1. A chip frequency control method, including:
determining a real-time computing power ratio of a chip of a blockchain server, a real-time temperature of the chip, and a real-time voltage of the chip; and
adjusting a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip, wherein the reference computing power ratio, the reference temperature, and the reference voltage are determined when the blockchain server enters a working status after undergoing a frequency rising phase after start-up.

2. The method according to claim 1, wherein the adjusting a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip includes at least one of the following:
reducing the setting frequency when the first comparison result indicates that the real-time computing power ratio is reduced compared with the reference computing power ratio, the second comparison result indicates that the real-time temperature remains unchanged compared with the reference temperature, and the third comparison result indicates that the real-time voltage is reduced compared with the reference voltage;
reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage is reduced compared with the reference voltage; and
reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage remains unchanged compared with the reference voltage.

3. The method according to claim 2, further including:
determining computing power compensation chip(s) among chips in the blockchain server other than chip(s) whose setting frequency (frequencies) is (are) reduced; and
increasing setting frequency (frequencies) of the computing power compensation chip(s).

4. The method according to claim 3, wherein the computing power compensation chip(s) includes at least one of the following:

a real-time computing power ratio of the computing power compensation chip is greater than or equal to a predetermined threshold, a real-time temperature of the computing power compensation chip is equal to a reference temperature of the computing power compensation chip, and a real-time voltage of the computing power compensation chip is greater than a reference voltage of the computing power compensation chip;

the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is equal to the reference voltage of the computing power compensation chip; and the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is greater than the reference voltage of the computing power compensation chip.

5. The method according to claim 4, wherein the determining a real-time computing power ratio of a chip of a blockchain server includes:
determining a theoretical computing power of the chip based on a quantity of cores in the chip and the setting frequency;
determining a real-time actual computing power of the chip based on a total quantity of arbitrary or non-repeating numbers (Nonce) that are used only once within a predetermined time up to a current moment, a Nonce difficulty of the chip, and the predetermined time; and
determining a ratio of the real-time actual computing power to the theoretical computing power as the real-time computing power ratio.

6. The method according to claim 3, wherein the determining wherein the determining a real-time computing power ratio of a chip of a blockchain server includes:
determining a theoretical computing power of the chip based on a quantity of cores in the chip and the setting frequency;
determining a real-time actual computing power of the chip based on a total quantity of arbitrary or non-repeating numbers (Nonce) that are used only once within a predetermined time up to a current moment, a Nonce difficulty of the chip, and the predetermined time; and
determining a ratio of the real-time actual computing power to the theoretical computing power as the real-time computing power ratio.

7. The method according to claim 2, further including:
determining, among chip(s) whose setting frequencies has (have) been reduced in the blockchain server, a chip whose real-time computing power ratio reaches a computing power ratio threshold at a predetermined time after the setting frequency is reduced as a computing power compensation chip; and
increasing the setting frequency of the computing power compensation chip at a frequency adjustment moment corresponding to the predetermined time.

8. The method according to claim 7, wherein the wherein the determining a real-time computing power ratio of a chip of a blockchain server includes:
determining a theoretical computing power of the chip based on a quantity of cores in the chip and the setting frequency;
determining a real-time actual computing power of the chip based on a total quantity of arbitrary or non-repeating numbers (Nonce) that are used only once within a predetermined time up to a current moment, a Nonce difficulty of the chip, and the predetermined time; and
determining a ratio of the real-time actual computing power to the theoretical computing power as the real-time computing power ratio.

9. The method according to claim 2, wherein the determining a real-time computing power ratio of a chip of a blockchain server includes:
determining a theoretical computing power of the chip based on a quantity of cores in the chip and the setting frequency;
determining a real-time actual computing power of the chip based on a total quantity of arbitrary or non-repeating numbers (Nonce) that are used only once within a predetermined time up to a current moment, a Nonce difficulty of the chip, and the predetermined time; and
determining a ratio of the real-time actual computing power to the theoretical computing power as the real-time computing power ratio.

10. The method according to claim 1, wherein the determining a real-time computing power ratio of a chip of a blockchain server includes:
determining a theoretical computing power of the chip based on a quantity of cores in the chip and the setting frequency;
determining a real-time actual computing power of the chip based on a total quantity of arbitrary or non-repeating numbers (Nonce) that are used only once within a predetermined time up to a current moment, a Nonce difficulty of the chip, and the predetermined time; and
determining a ratio of the real-time actual computing power to the theoretical computing power as the real-time computing power ratio.

11. A blockchain server, including:
a chip board, including a plurality of chips; and
a control board, including: a memory and a processor, wherein the memory stores an application program executable by the processor, to cause the processor to perform the chip frequency control method according to claim 1, wherein the chip board has a signal connection with the control board through a signal connection interface, and the chip board forms a power connection with a power supply through a power supply connection interface.

12. A chip frequency control apparatus, including:
a determining module, configured to determine a real-time computing power ratio of a chip of a blockchain server, a real-time temperature of the chip, and a real-time voltage of the chip; and
an adjustment module, configured to adjust a setting frequency of the chip based on a first comparison result of the real-time computing power ratio with a reference computing power ratio of the chip, a second comparison result of the real-time temperature with a reference temperature of the chip, and a third comparison result of the real-time voltage with a reference voltage of the chip, wherein the reference computing power ratio, the reference temperature, and the reference voltage are determined when the blockchain server enters a working status after undergoing a frequency rising phase after start-up.

13. The apparatus according to claim 12, wherein
the adjustment module is configured to perform at least one of the following operations:
reducing the setting frequency when the first comparison result indicates that the real-time computing power ratio is reduced compared with the reference computing power ratio, the second comparison result indicates that the real-time temperature remains unchanged compared with the reference temperature, and the third comparison result indicates that the real-time voltage is reduced compared with the reference voltage;
reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage is reduced compared with the reference voltage; and
reducing the setting frequency when the first comparison result indicates that the real-time computing power ratio is reduced compared with the reference computing power ratio, the second comparison result indicates that the real-time temperature is reduced compared with the reference temperature, and the third comparison result indicates that the real-time voltage remains unchanged compared with the reference voltage.

14. The apparatus according to claim 12, wherein the adjustment module is configured to determine computing power compensation chip(s) among chips in the blockchain server other than chip(s) whose setting frequency (frequencies) is (are) reduced; and increase setting frequency (frequencies) of the computing power compensation chip(s).

15. The apparatus according to claim 12, wherein the computing power compensation chip(s) includes (include) at least one of the following:
a real-time computing power ratio of the computing power compensation chip is greater than or equal to a predetermined threshold, a real-time temperature of the computing power compensation chip is equal to a reference temperature of the computing power compensation chip, and a real-time voltage of the computing power compensation chip is greater than a reference voltage of the computing power compensation chip;
the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is equal to the reference voltage of the computing power compensation chip; and
the real-time computing power ratio of the computing power compensation chip is greater than or equal to the threshold, the real-time temperature of the computing power compensation chip is greater than the reference temperature of the computing power compensation chip, and the real-time voltage of the computing power compensation chip is greater than the reference voltage of the computing power compensation chip.

16. The apparatus according to claim 12, wherein
the adjustment module is configured to determine, among chip(s) whose setting frequency (frequencies) has (have) been reduced in the blockchain server, a chip whose real-time computing power ratio reaches a computing power ratio threshold at a predetermined time after the setting frequency is reduced as a computing power compensation chip; and increase the setting frequency of the computing power compensation chip at a frequency adjustment moment corresponding to the predetermined time.

17. The apparatus according to claim 12, wherein
the determining module is configured to: determine a theoretical computing power of the chip based on a quantity of cores in the chip and the setting frequency; determine a real-time actual computing power of the chip based on a total quantity of arbitrary or non-repeating numbers (Nonce) that are used only once within a predetermined time up to a current moment, a Nonce difficulty of the chip, and the predetermined time; and determine a ratio of the real-time actual computing power to the theoretical computing power as the real-time computing power ratio.

\* \* \* \* \*